US011511316B2

(12) United States Patent
Furusho

(10) Patent No.: US 11,511,316 B2
(45) Date of Patent: Nov. 29, 2022

(54) PLASMA ANNEALING METHOD AND DEVICE FOR THE SAME

(75) Inventor: Hitoshi Furusho, Funabashi (JP)

(73) Assignee: NISSAN CHEMICAL INDUSTRIES, LTD., Tokyo (JP)

(*) Notice: Subject to any disclaimer, the term of this patent is extended or adjusted under 35 U.S.C. 154(b) by 0 days.

(21) Appl. No.: 13/883,042

(22) PCT Filed: Oct. 31, 2011

(86) PCT No.: PCT/JP2011/075068
§ 371 (c)(1),
(2), (4) Date: May 2, 2013

(87) PCT Pub. No.: WO2012/060325
PCT Pub. Date: May 10, 2012

(65) Prior Publication Data
US 2013/0224396 A1 Aug. 29, 2013

(30) Foreign Application Priority Data
Nov. 4, 2010 (JP) .............................. JP2010-247339

(51) Int. Cl.
B05D 3/04 (2006.01)
H01L 21/326 (2006.01)
H01L 21/02 (2006.01)

(52) U.S. Cl.
CPC .......... B05D 3/04 (2013.01); H01L 21/02532 (2013.01); H01L 21/02689 (2013.01); H01L 21/326 (2013.01)

(58) Field of Classification Search
CPC .......... B05D 3/04; B05D 3/141; B05D 3/145; B05D 3/148; H01L 21/02532; H01L 21/02689; H01L 21/326
See application file for complete search history.

(56) References Cited

U.S. PATENT DOCUMENTS 5,685,949 A * 11/1997 Yashima .................. 438/694
6,130,397 A * 10/2000 Arai .................... 219/121.37
(Continued)

FOREIGN PATENT DOCUMENTS

JP 02080577 A * 3/1990
JP H03-135018 A 6/1991
(Continued)

OTHER PUBLICATIONS

Ohring, M., "Materials Science of Thin Films—Deposition and Structure", 2002, Elsevier, 2nd Ed., p. 147-152.*
(Continued)

Primary Examiner — Katherine A Bareford
Assistant Examiner — Christina D McClure
(74) Attorney, Agent, or Firm — Oliff PLC

(57) ABSTRACT

There is provided a plasma annealing device that can change the crystal structure of a film by processing the film (coating) on a substrate and that has excellent productivity. A method for producing a film includes step (A) irradiating a film on a substrate with atmospheric pressure plasma, wherein the crystal structure of a constituent of the film is changed. The step (A) may include generating plasma under atmospheric pressure by energization at a frequency of 10 hertz to 100 megahertz and a voltage of 60 volts to 1,000,000 volts, and directly irradiating the film on the substrate with the generated plasma. A method for changing a crystal structure of a constituent of a film includes step (A). A plasma generation device used in step (A). An electronic device produced through step (A).

14 Claims, 3 Drawing Sheets

(56) References Cited

U.S. PATENT DOCUMENTS

| | | | | |
|---|---|---|---|---|
| 2005/0194099 | A1* | 9/2005 | Jewett, Jr. | H01J 37/321 |
| | | | | 156/345.48 |
| 2006/0141290 | A1* | 6/2006 | Sheel | C23C 16/405 |
| | | | | 428/701 |
| 2009/0068375 | A1* | 3/2009 | Dobbyn | B05D 1/62 |
| | | | | 427/489 |
| 2010/0009469 | A1* | 1/2010 | Kai | H01J 37/32412 |
| | | | | 438/7 |
| 2010/0163534 | A1* | 7/2010 | Riccardi | B29C 59/14 |
| | | | | 219/121.59 |

FOREIGN PATENT DOCUMENTS

| | | | |
|---|---|---|---|
| JP | A-06-173044 | | 6/1994 |
| JP | A-08-250488 | | 9/1996 |
| JP | A-11-145148 | | 5/1999 |
| JP | H11-260597 A | | 9/1999 |
| JP | 2001-085701 A | | 3/2001 |
| JP | A-2002-164543 | | 6/2002 |
| JP | A-2003-100652 | | 4/2003 |
| JP | 2004-296729 A | | 10/2004 |
| JP | 2006-060130 A | | 3/2006 |
| JP | 2008053634 A | * | 3/2008 |
| JP | A-2008-053634 | | 3/2008 |
| JP | 2008-519411 A | | 6/2008 |
| JP | A-2009-200314 | | 9/2009 |
| JP | 2010-056483 A | | 3/2010 |
| JP | 2010-103160 A | | 5/2010 |
| WO | 2008/072390 A1 | | 6/2008 |

OTHER PUBLICATIONS

JP2008053634 Machine Translation, originaly published 2008, p. 1-29.*

ASM International Handbook Committee, "ASM Handbook—Plasma Melting and Heating", 2008, ASM International, p. 149-154.*

Goldfarb, V., Woodroffe, J., "Deposition of Thin Films and Coatings by Atmospheric Pressure Vapor Plasma Jet", 1989, Plasma Chemsitry and Plasma Procesing, vol. 9, No. 1, p. 195S-206S.*

Ohmi, H., Kakiuchi, H., Nishijima, K., Watanabe, H., Yasutake, K., "Low-Temperature Crystallization of Amorphous Silicon by Atmospheric-Pressure Plasma Treatment in $H_2/He$ or $H_2/Ar$ Mixture", 2006, Jpn. J. Appl. Phys., 45, p. 8488-8493.*

Laroussi, M., Lu, X., "Room-Temperature Atmospheric Pressure Plasma Plume for Biomedical Applications", 2005, Appl. Phys. Lett. 87, 113902-1-113902-3.*

Lengsfeld, P., Nickel, N.H., Fuhs, W., "Step-by-Step Excimer Laser Induced Crystallization of a-Si:H", 2000, Applied Physics Letters, 76, p. 1680-1682 (Year: 2000).*

JP-02080577-A, machine translation, originally published 1990, p. 1-13 (Year: 1990).*

English-language Translation of Written Opinion of the International Searching Authority issued in International Application No. PCT/JP2011/075068 dated Dec. 27, 2011.

Ohsaki, H., "Room-Temperature Crystallization of Amorphous Films by RF Plasma Treatment". Thin Solid Films, vol. 517, pp. 3092-3095, 2009.

* cited by examiner

[FIG. 1]
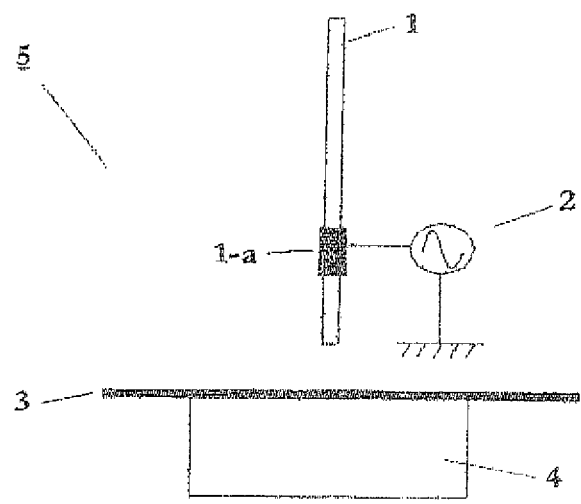
[FIG. 2]
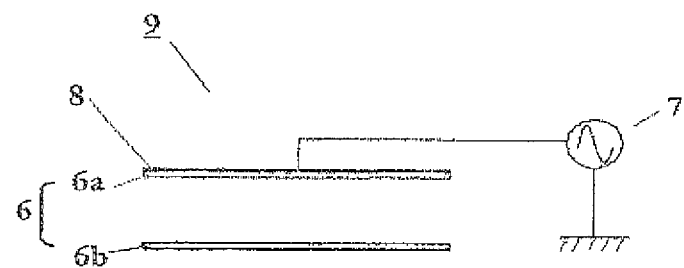

[FIG. 3]
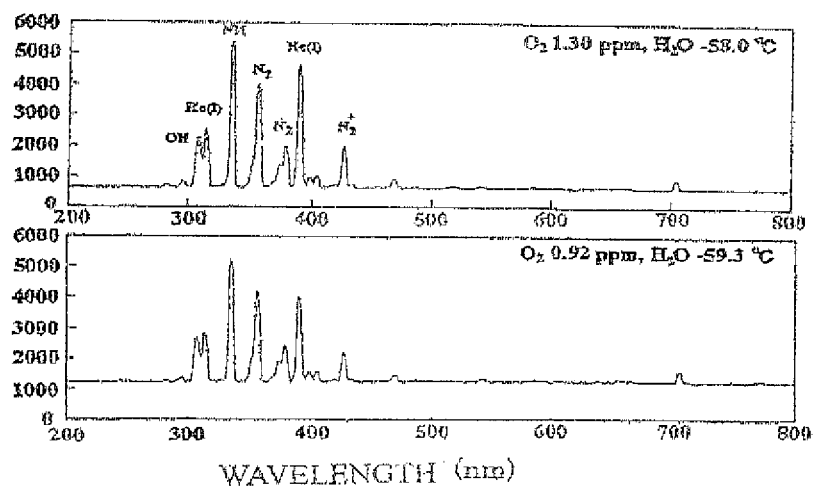
[FIG. 4]
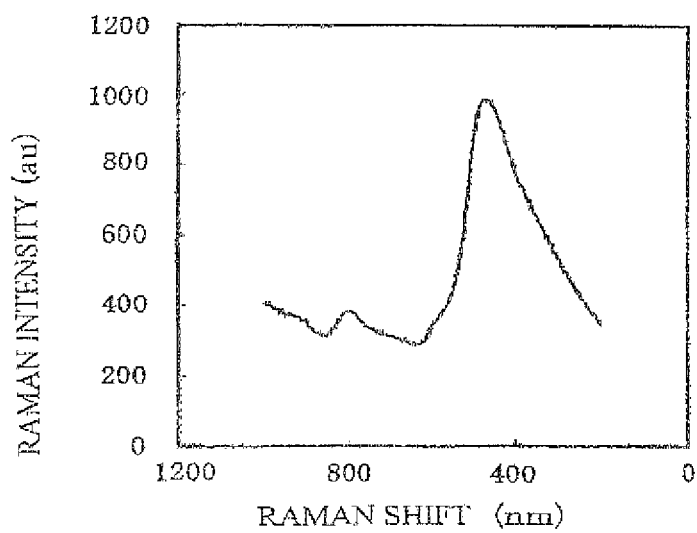

[FIG. 5]
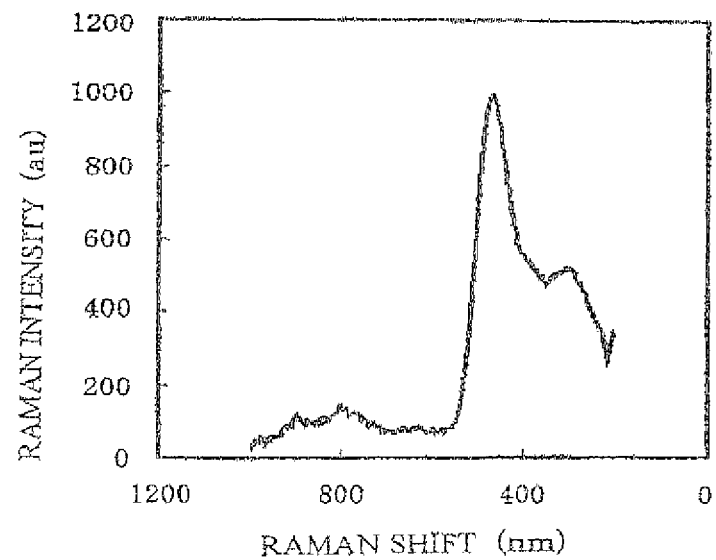
[FIG. 6]
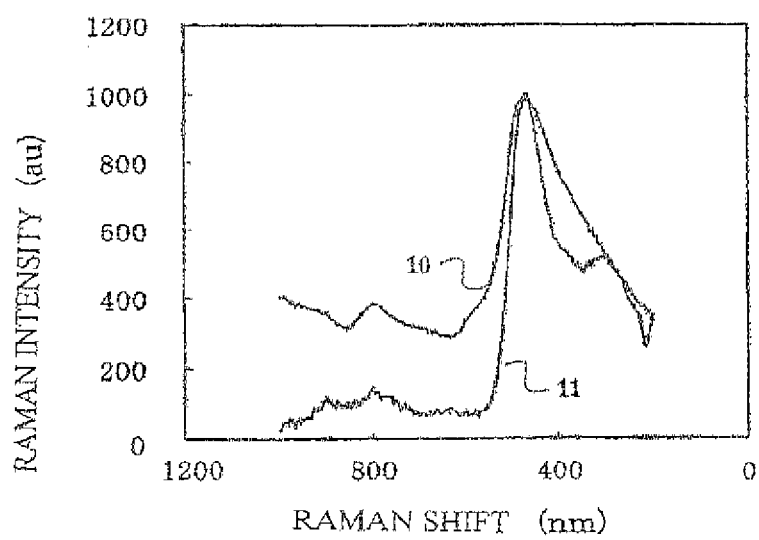

PLASMA ANNEALING METHOD AND DEVICE FOR THE SAME

TECHNICAL FIELD

The present invention relates to a method for producing a film that changes the crystal structure of a constituent of the film by plasma and a plasma annealing device used for the method.

BACKGROUND ART

In an amorphous inorganic structure formed by a chemical vapor deposition method or the like, conduction electrons are scattered in electron conduction depending on a bonding state of the structure and the structure becomes a resistor for transfer behavior of the electrons. In other words, the bonding state of the structure strongly affects the electron transfer properties of the structure. Consequently, the electron transfer behavior can be significantly improved by properly arranging bonds between atoms and crystallizing them.

In order to change the bonding state of the structure, the atoms in the bonded state are necessary to be strongly shaken, which requires a large amount of thermal energy. For this reason, currently, in the case of formation of a structure film, which is a type of the film having such a structure, an amorphous structure film is converted to a polycrystalline film by a method for thermally processing an amorphous film formed on a substrate by a vapor-phase growth method or the like at a high temperature using an electric furnace or the like (a direct heating method) and a method for heating the amorphous film by irradiating the film with laser light (a laser annealing method).

In the direct heating method by heat baking as described above, the film and the whole substrate on which the film is formed are heated. Therefore, the temperature of heat baking is restricted by the heat resistant temperature of the substrate when the film is formed on a substrate that is relatively heat-sensitive, for example, glass.

By contrast, the laser annealing method uses a laser having specific wavelength, and thus, the temperature hardly rises in a substrate that does not absorb the laser light. For this reason, it is expected that, by selecting laser light having a wavelength that the film absorbs but the substrate does not absorb, the bonding state of the film can be changed by irradiating the film with laser light almost without raising the temperature of the substrate.

However, for example, in a process of converting an amorphous silicon film into a polysilicon film by the laser annealing method, existence of impurity gases such as oxygen in an irradiation region of the laser light may cause absorption of these impurity gases into the silicon film. This may cause deterioration in characteristics due to impurity contamination, reduction in crystal size and surface roughness of the polysilicon film converted from the amorphous silicon film, inhibition of equalization of surface orientation, and the like. Thus, it is important that the impurity gas does not exist in the irradiation region of the laser light.

In order to decrease an impurity gas concentration in an irradiation region of laser light, a conventional laser annealing device for converting an amorphous silicon film into a polysilicon film includes, for example, a highly air tight chamber that can enclose the whole substrate including the amorphous silicon film, and a process including discharging the impurity gas by evacuating the gas in the chamber and thereafter replacing inside of the chamber with an inert gas is carried out (Patent Document 1).

However, the method that controls whole gas atmosphere in the chamber requires an expensive vacuum chamber and a large-scale exhaust system. This causes a problem of high apparatus cost and running cost. In addition, the size of the vacuum chamber that encloses the whole substrate needs to be increased depending on the size of the substrate, and therefore, a problem arises that the whole device becomes larger particularly when a large substrate is processed.

At the time of polycrystalline substance formation, the shape of laser light is devised because the uniformity of the crystal strongly affects the electric properties of the crystal. Generally, in circular laser light, its intensity is exponentially high at the center part thereof. Direct irradiation of laser light to an inorganic structure therefore results in preferential crystallization of only the irradiation center, and thus, the film is uniform in the crystallization.

For this reason, generally, a method has been employed in which spot laser light is converted into rectangular laser light through a cylindrical lens, and thereafter the intensity of the rectangular laser light is made uniform by using a homogenizer, and an inorganic structure is crystallized by scanning with rectangular laser light having uniform intensity (Patent Document 2).

However, in the laser annealing device having the configuration as described above, the laser annealing at high temperature is still required and a problem of uniformity of crystallization still cannot be improved.

Although structural change is not involved, another method has been developed for forming a film using plasma in which plasma is generated after gas for forming an amorphous silicon film is introduced under high vacuum and the amorphous silicon film is formed on a substrate (Patent Document 3).

RELATED ART DOCUMENTS

Patent Documents

Patent Document 1: Japanese Patent Application Publication No. 2002-164543 (JP 2002-164543 A)
Patent Document 2: Japanese Patent Application Publication No. 2003-100652 (JP 2003-100652 A)
Patent Document 3: Japanese Patent Application Publication No. 6-173044 (JP 6-173044 A)

SUMMARY OF THE INVENTION

Problem to be Solved by the Invention

Uniformity of laser irradiation effect is the remaining problem that should be improved in the laser annealing method described above. Various methods have been studied for improving the uniformity.

One method is a method in which the shape of energy distribution of a beam is made to be closer to a rectangular shape as much as possible through a slit, whereby fluctuation within the linear beam is reduced.

In addition to the method, it has been reported that uniformity is improved by carrying out pre-irradiation with pulse laser light weaker than strong pulse laser light before irradiation with the strong pulse laser light for further reduction in ununiformity.

Carrying out this pre-irradiation is highly effective, and properties of a semiconductor device can be remarkably improved. This is because crystallization of the semiconductor film can be carried out in a stepwise manner by irradiating the film with two stages of the laser light having different irradiation energy, and thus, various problems associated with rapid phase change, that is, ununiformity of crystallization and generation of crystal boundary that are observed in the conventional laser annealing in which pre-irradiation is not carried out, and concentration of stress, can be reduced. The effect of this stepwise irradiation can be further enhanced by increasing the number of times that multi-step irradiation is carried out.

These two methods can improve uniformity of the laser irradiation effect significantly.

However, in the two-step irradiation method as described above, the throughput decreases because the laser process time doubles, and the cost also increases because the equipment for two-step irradiation is complex compared with one-step irradiation, and thus, a problem of productivity arises.

Although the uniformity of laser irradiation effect can be improved significantly, the degree of improvement is far from satisfactory level. Thus, a method for further improving both productivity and performance is required.

The present invention was devised in light of the circumstances described above, and it is an object of the present invention to provide a plasma annealing device that can surely change the crystal structure of a film by processing the film (coating) on a substrate in a simple configuration and that has excellent productivity.

Means for Solving the Problem

The present invention provides, as a first aspect, a method for producing a film, the method characterized by including: (A) irradiating a film on a substrate with atmospheric pressure plasma, wherein the crystal structure of a constituent of the film is changed;

as a second aspect, the method for producing the film according to the first aspect, in which step (A) includes generating plasma under atmospheric pressure by energization at a frequency of 10 hertz to 100 megahertz and a voltage of 60 volts to 1,000,000 volts, and directly irradiating the film on the substrate with the generated plasma;

as a third aspect, the method for producing the film according to the first aspect, in which step (A) includes generating plasma under atmospheric pressure by energizing high voltage electrodes of a discharge tube or one of two counter electrodes at a frequency of 10 hertz to 100 megahertz and a voltage of 60 volts to 1,000,000 volts, and flowing gas for plasma generation through inside of the discharge tube or between the two counter electrodes; and directly irradiating the film on the substrate with the generated plasma;

as a fourth aspect, the method for producing the film according to the third aspect, in which the discharge tube used in step (A) is made of an inorganic dielectric material, an organic polymer, or a metal;

as a fifth aspect, the method for producing the film according to the third aspect, in which the two counter electrodes used in step (A) are made of a flat-plate dielectric body or a flat-plate metal;

as a sixth aspect, the method for producing the film according to the fifth aspect, in which the flat-plate dielectric body used in step (A) is made of an inorganic dielectric material or an organic polymer;

as a seventh aspect, the method for producing the film according to any one of the third aspect to the sixth aspect, in which the gas for plasma generation used in step (A) is at least one gas selected from the group consisting of helium, argon, krypton, xenon, hydrogen, nitrogen, oxygen, sulfur disulfide, hydrogen sulfide, water vapor, carbon monoxide, carbon dioxide, ammonia, a nitrogen oxide, a halogen, a hydrogen halide, silane, $GeH_4$, $PH_4$, $AsH_3$, $B_2H_6$;

as an eighth aspect, the method for producing the film according to any one of the third aspect to the seventh aspect, in which, when oxygen is not used as the gas for plasma generation, step (A) is carried out in a chamber where an oxygen concentration is maintained 100 ppm or less;

as a ninth aspect, the method for producing the film according to any one of the first aspect to the eighth aspect, in which the film on the substrate is irradiated with plasma while being heated in step (A);

as a tenth aspect, a method for changing a crystal structure of a constituent of a film including step (A) described in any one of the first aspect to the ninth aspect;

as an eleventh aspect, a plasma generation device used in step (A) in the method for producing the film according to any one of the first aspect to the ninth aspect; and as a twelfth aspect, an electronic device produced through step (A) in any one of the first aspect to the ninth aspect.

Effects of the Invention

In the method for producing the film of the present invention, only a part where plasma particles collide can be gradually crystallized in a plasma irradiation device (a plasma annealing device).

Particularly, the atmospheric pressure plasma used in the present invention (thermal nonequilibrium plasma) can change the form and bonding state of the structure in the irradiation region without raising surrounding temperature. In other words, the atmospheric pressure plasma can crystallize the structure at a low temperature. A plasma density can be controlled by frequency and voltage of an applied electric source, or a gas concentration of gas for plasma generation. A degree of crystallization and crystallization time can be controlled by controlling these factors. As described above, crystallization can be carried out while controlling at a low temperature with the plasma controlled under atmospheric pressure.

In the method for producing the film of the present invention, for example, an oxygen concentration around an irradiation region where the film on the substrate is irradiated with plasma can be maintained in an extremely low concentration by using a high purity gas for a film having a problem of oxidation. For this reason, the film irradiated with the plasma can be converted into a film that eliminates the effect caused by oxygen, has uniform crystal grain diameter and surface roughness, and equalizes the surface orientation.

In the method for producing the film of the present invention, the configuration of the plasma irradiation device (the plasma annealing device) can be simplified so that the cost can be reduced while achieving reduction in weight and size, because the device can eliminate the need for a highly air-tight chamber that maintains the whole substrate in vacuum or in inert gas atmosphere. As a result, maintenance effort can be significantly reduced, and thus, the running costs can be reduced, whereby productivity is increased. Of course, gas replacement can be carried out using a highly air-tight chamber when presence of oxygen is not desired. However, even in this case, a conventional chamber for high vacuum is not required.

BRIEF DESCRIPTION OF THE DRAWINGS

FIG. 1 is a schematic view illustrating an example of a plasma irradiation device using a discharge tube used in the present invention.

FIG. 2 is a schematic view illustrating an example of a plasma irradiation device using flat-plate electrodes (counter electrodes) used in the present invention.

FIG. 3 is charts illustrating plasma discharge spectra.

FIG. 4 is a graph illustrating a Raman spectrum measurement result of an amorphous silicon film formed by CVD.

FIG. 5 is a graph illustrating a Raman spectrum measurement result of a film obtained by irradiating the amorphous silicon film formed by CVD, with plasma by a method of the present invention.

FIG. 6 is a graph illustrating the Raman spectrum measurement results of the film before and after plasma irradiation, and also an illustration view illustrating a validation result of the present invention based on the difference between them.

MODES FOR CARRYING OUT THE INVENTION

A method for producing a film, which is the subject of the present invention, is to provide a following plasma annealing method and a device used for the method, in order to solve the problem described above.

In other words, the method for producing the film of the present invention is characterized by changing a crystal structure of the film by irradiating the film formed on a substrate with atmospheric pressure plasma, wherein a plasma irradiation device (an annealing device) can be used at the time of plasma irradiation.

The plasma irradiation device includes: a stage on which the substrate on which the film is formed is mounted; and, above the stage, a discharge tube or high voltage flat-plate electrodes (counter electrodes) that irradiates the substrate with plasma, in which plasma is formed near atmospheric pressure by applying high-frequency high voltage while flowing gas for plasma generation to the discharge tube in the case of the discharge tube, or by retaining the gas for plasma generation between the substrate on which the film is formed and the flat-plate electrode in the case of the flat-plate electrodes. Although the plasma is not particularly limited, glow-like discharge is desirable when a stable annealing process is carried out.

Hereinafter, the method for producing the film according to the present invention will be described with the plasma irradiation device (the plasma annealing device) based on the drawings. This embodiment is specifically described for the purpose of understanding the spirit of the invention better, and thus, this embodiment does not limit the present invention unless otherwise stated. A method for converting an amorphous silicon film on the substrate into a polysilicon film by a CVD method is exemplified as one example of changing the crystal structure of the film covered on the substrate. Of course, however, the target film of the production method of the present invention is not limited to silicon films.

The present invention is a method for producing a film, the method including: (A) irradiating a film on a substrate with atmospheric pressure plasma, in which the crystal structures of constituents of the film are changed.

The atmospheric pressure plasma means plasma generated under atmospheric pressure (760 Torr). However, at the time of generating plasma under atmospheric pressure, a pressure in the system may vary due to inflow and exhaust of the gas for plasma generation, and the pressure may vary from 760 Torr to a pressure that is about 100 Torr higher or lower than 760 Torr.

The constituent of the film means a component forming the film. In the case of an amorphous silicon film, for example, the constituent means silicon. To change the crystal structure of the constituent of the film means, for example, to change the crystal structure of this silicon from amorphous silicon into polysilicon.

In addition to silicon, examples of the constituent of the film may include metal oxides, metal sulfides, dopant-containing silicon, and compound semiconductors.

Examples of the metal oxides include silicon oxide, zirconium oxide, aluminum oxide, nickel oxide, iron oxide, zinc oxide, titanium oxide, and cobalt oxide.

Examples of the metal sulfides include zinc sulfide, cadmium sulfide, titanium sulfide, cobalt sulfide, and iron sulfide.

Examples of the dopant-containing silicon include boron or phosphorus doped silicon.

Examples of the compound semiconductors include gallium arsenide, aluminum gallium arsenide, indium phosphide, and gallium nitride.

FIG. 1 is a schematic view illustrating one example of a plasma irradiation device (a plasma annealing device) used in the present invention. The schematic view illustrates a plasma jet annealing device using a discharge tube. Here, the plasma annealing means a plasma irradiation process performed during, for example, crystal change from amorphous silicon to polysilicon.

As described in FIG. 1, the plasma irradiation (the plasma annealing) device 5 includes a stage 4 on which a substrate 3 covered with a film which is a processing material is mounted and a discharge tube 1 that irradiates the substrate 3 with plasma, spaced above the stage 4. A power source 2 is connected to a high voltage electrode 1-a provided at the tip end of the discharge tube 1.

In the device illustrated in FIG. 1, the stage 4 has a structure such that the stage 4 is movable in an X axis direction and a Y axis direction in a plane of the stage 4 by a stage movement means. In the structure, an irradiation position of plasma is fixed, and the whole surface of the substrate 1 on the stage 4 can be irradiated with plasma by moving the stage 4 in the X axis direction and the Y axis direction in the plane. In some cases, in addition to the X axis direction and the Y axis direction, irradiation also can be carried out by stereoscopically moving the stage 4 in a Z axis direction that is perpendicular to the stage 4.

In the device illustrated in FIG. 1, plasma is injected from the tip of the discharge tube in a jet-like manner. The plasma has plasma particle temperature required for converting the film formed on the whole surface of the substrate 1, e.g., an amorphous silicon film, to a polysilicon film. A plasma density can be controlled by controlling plasma parameters such as voltage and frequency of the power source 2 connected to the high voltage electrode 1-a of the discharge tube and a gas flow rate of the gas for plasma generation. This control can change the state of the film freely.

In this device, process time (plasma irradiation time) can be controlled by scanning in a predetermined line speed to the Y axis direction of the stage 4.

The plasma density also can be changed by changing a height at which the discharge tube 1 of the plasma irradiation device (the plasma annealing device) 5 is provided.

The discharge tube 1 used in the device illustrated in FIG. 1 is not particularly limited. For example, a dielectric body such as glass is used, and plasma jet is easily generated by locating the high voltage electrode 1-a at the tip of the discharge tube and connecting the power source 2 to the high voltage electrode. In this case, the generated plasma, which is dielectric barrier plasma, is thermal nonequilibrium plasma, and thus, rise of surrounding temperature can be reduced.

The plasma irradiation device (the plasma annealing device) used in the present invention can be formed using counter flat-plate electrodes as illustrated in FIG. 2. Basically, the plasma jet device as illustrated in FIG. 1 is preferable for local structural change. However, the device is not suitable for a large area process. The large area process can be carried out by using a device in which plasma is generated between the flat-plate electrodes as illustrated in FIG. 2.

FIG. 2 illustrates a plasma generation device using the counter flat-plate electrodes. A distance between the counter electrodes 6 can be used as one parameter for changing the plasma density. In the counter electrodes 6, a high voltage electrode 8 is usually connected to an upper electrode 6a, a power source 7 is connected to the high voltage electrode 8, and an earth is connected to a lower electrode 6b. However, the earth is not particularly required to be connected. The gas for plasma generation is flown between these counter electrodes 6. In this case, although a gas chamber is preferably used in order to avoid unstable plasma generation caused by the gas flow, a state of reduced pressure is not particularly required in this case and various states of plasma from atmospheric pressure to reduced pressure can be generated. The film formed on the substrate is placed between the electrodes and is subjected to plasma processing for a predetermined time.

Hereinafter, each constitution element that constitutes the plasma irradiation device used in the present invention will be described in detail.

In the present invention, under pressure of atmospheric pressure (near atmospheric pressure), plasma is generated in a discharge tube made by attaching high voltage electrode to a metal tube or an insulator tube by applying low frequency and high voltage electricity while flowing the gas for plasma generation in the discharge tube and the film is irradiated with the generated plasma, whereby the form and bonding state of the constituents of the film can be changed.

When the metal tube is used as the discharge tube, only the high voltage electrode is connected to the metal tube and the atmosphere is used for the ground (FIG. 1). When the insulator tube such as a plastic tube is used as the discharge tube, an earth can be attached to a front side and a back side of the high voltage electrode (the earth keeps such a distance not to touch the high voltage electrode, or the earth and the electrode are apart from each other more than such a distance that arc discharge does not occur). However, similar to the metal tube, the atmosphere may be used for the ground.

A material of the nozzle part of the discharge tube used for plasma emission is made of elements themselves included in the fourth group to the fourteenth group of the periodic table or compounds thereof. The high voltage electrode is connected to the discharge tube, and low frequency, high voltage is applied while flowing the gas with the atmosphere serving as the ground, whereby an ionized gas or a radical gas can be generated.

The plasma irradiation device does not necessarily need to emit a plasma jet injected from the pencil-like nozzle (FIG. 1). Stable atmospheric pressure plasma can be generated by applying an alternating electric field to the two flat-plate electrodes that face each other and flowing through the space between the electrodes the gas that can be a plasma gas (the gas for plasma generation: the gas is not particularly limited, but helium gas is exemplified; refer to the description below). The plasma process can be achieved by placing the processing substrate in the space (FIG. 2).

This device has a structure in which two flat-plate dielectric bodies or flat metal plates are faced, and one plate is connected to the high voltage electrode and the other plate is connected to an earth electrode or is not connected to an earth but forms an atmospheric earth.

The two flat-plate dielectric bodies or flat metal plates are placed in atmospheric pressure, and plasma is generated from an introduced gas (the gas for plasma generation) by applying high voltage in low frequency. Thus, the processing substrate can be irradiated with the obtained plasma. Alternatively, the two flat-plate dielectric bodies or flat metal plates are placed in a low pressure container, and the introduced gas was flown after reducing the pressure. Plasma is generated from the introduced gas by applying high voltage in low frequency under the reduced pressure. The obtained plasma also can be applied to the processing substrate.

When the counter flat-plate electrodes are used, the shape of the electrodes is not particularly limited. A material such as a copper mesh on which electric field can be focused as much as possible is preferably used in order to stabilize discharge.

This is because abnormal electrical discharge from a specific weak area on the surface of the electrodes is avoided, and this is important for maintaining stable glow-like discharge at a pressure near atmospheric pressure.

When either the discharge tube or the counter electrodes is used, an inorganic dielectric material, an organic polymer, and a metal can be used as the electrode material.

Examples of the metal include aluminum, stainless steel, copper, iron, and brass. Any of metal tubes or metal electrodes in which a gas channel is formed can be used.

The organic polymer serving as an insulating material is not particularly limited. General purpose plastics, engineering plastics, and super engineering plastics can be used. Examples of the general purpose plastics include polyethylene (high-density polyethylene, medium-density polyethylene, and low-density polyethylene), polypropylene, polyvinyl chloride, polyvinylidene chloride, polystyrene, polyvinyl acetate, an acrylonitrile butadiene styrene resin (an ABS resin), an acrylonitrile styrene resin (an AS resin), an acrylic resin, and polytetrafluoroethylene. The engineering plastics are not particularly limited, and examples thereof include polyamide, nylon, polyacetal, polycarbonate, modified polyphenylene ether (m-PPE, modified PPE), polybutylene terephthalate, polyethylene terephthalate, a polyethylene terephthalate-glass resin (PET-G), a cyclic polyolefin, and a glass-fiber reinforced polyethylene terephthalate (FRP). The super engineering plastics are not particularly limited, and examples thereof include polyphenylene sulfide, polysulfone, polyether sulfone, amorphous polyarylate, a liquid crystalline polyester, polyether ether ketone, polyamide imide, polyimide, and polyamide.

The inorganic dielectric materials also can be used as insulating materials. The inorganic dielectric materials are not particularly limited, and specific examples thereof include glass, silicon, zirconia, ceramic, alumina, titania, silicon carbide, and silicon nitride.

An alternating current high voltage power source is used as a power source required for plasma generation. Frequency of the alternating current is 10 Hz to 100 MHz, preferably 50 Hz to 100 kHz, and further preferably 5 kHz to 20 kHz. Plasma can be generated in a range of the alternating voltage of 60 V to 1,000,000 V. The alternating voltage is preferably 1,000 V to 20,000 V, and further preferably 5,000 V to 10,000 V.

Irradiation time of plasma to the film on the substrate is usually several minutes to several hours. Plasma irradiation can be carried out for, for example, about 5 minutes to 24 hours, about 5 minutes to 10 hours, about 10 minutes to 2 hours, or about 20 minutes to 1 hour.

The film on the substrate can be irradiated with plasma at room temperature (about 20° C.). However, plasma irradiation can also be carried out while heating the substrate, that is, heating the film. The heating temperature is about 50° C. to 450° C. or about 100° C. to 250° C.

The gas for plasma generation used in the present invention is not particularly limited. Any gas that can be ionized can be used.

In detail, when the plasma generated under the conditions described above is used as reaction active species, at least one gas selected from the group consisting of eighteenth group elements (helium, neon, argon, krypton, and xenon), hydrogen, nitrogen, oxygen, carbon monoxide, carbon dioxide (carbon dioxide gas), nitrogen oxides (nitrogen monoxide, nitrogen dioxide), ammonia, a halogen, a hydrogen halide, sulfur disulfide, hydrogen sulfide, water vapor, silane, $GeH_4$, $PH_4$, $AsH_3$, and $B_2H_6$ is used as gas that is introduced into the discharge tube or between the flat-plate electrodes as the gas for plasma generation.

Helium gas is usually used when plasma is stably generated under atmospheric pressure. This is because helium forms a metastable state at the time of returning to the ground state after ionization, whereby the plasma can stably be generated.

Also, gas ionization is possible for nitrogen and oxygen. In this case, however, more stable plasma generation is also possible when helium is mixed.

More specifically, as the gas for plasma generation, a pure helium gas or a mixed gas of helium and at least one gas selected from the group consisting of hydrogen, oxygen, nitrogen, a carbon dioxide gas, carbon monoxide, fluorine, and chlorine can be used. In the mixed gas, to one volume of helium, at least one gas selected from the group consisting of hydrogen, oxygen, nitrogen, a carbon dioxide gas, carbon monoxide, fluorine, and chlorine can be 10 volumes or less, preferably 0.1 volumes or less, and further preferably 0.001 volumes or less. The mixed gas is not limited to a two-component gas, and three or more gases can be mixed and used.

The states of the generated plasma and the radical that is a second product of the plasma can be changed by mixing two or more gases for plasma generation. The change can be observed by an emission spectrum of the plasma. For example, ionization energy of helium excites nitrogen molecules by introducing nitrogen into helium, and this provides energy corresponding to ultraviolet light (refer to FIG. 3). Various radicals and ion species derived from the nitrogen gas are generated by ionizing helium in the nitrogen gas.

A flow rate of the gas used is a factor affecting the plasma parameters and the flow rate can be generally used in a range of 1 milliliter per second or more and 1,000 milliliters per second or less. The flow rate can be used in preferably 10 milliliters per second to 500 milliliters per second or less, and further preferably 30 milliliters per second or more and 100 milliliters per second or less.

As described above, the form (crystal structure) of the constituent of the film can be changed by irradiating the film with the generated plasma. Although not particularly limited, for example, when an amorphous silicon film formed by CVD is irradiated with the plasma, the bonding state of the amorphous silicon film can be easily changed.

At this time, although not particularly limited, when plasma jet is used, the bonding state at the plasma irradiation part can be changed by mounting the substrate on which the film is formed on the XY stage and scanning in the X axis direction or the Y axis direction with the plasma jet being fixed. When the irradiation target of plasma is an amorphous silicon film, form change before and after plasma irradiation can be traced by Raman scattering. According to Raman scattering, the broad bonding originated in amorphous silicon is observed in 200 nm to 600 nm at first. While the plasma irradiation is carried out, the peak position is shifted and a sharp peak of polysilicon is gradually generated beside the broad peak. Finally, the broad peak of the amorphous silicon fades away and only the peak of the polysilicon is observed.

At this time, particularly when the thermal nonequilibrium plasma generated by the discharge tube using a dielectric body is irradiated, the temperature of the substrate itself does not rise. As a result, only the form of the amorphous silicon film is changed and the shape of the substrate is not changed, which can be a great feature. Formation of an oxide layer during the form change is not desirable because the form change of amorphous silicon is a general technique required in many cases in semiconductor industry. Consequently, although not particularly limited, the formation of the oxide film can be prevented by a plasma process under an environment that blocks oxygen such as a glove box.

A plasma density can be increased by using a metal tube as a discharge tube material. In this case, the surrounding temperature can be slightly raised compared with the plasma generated by using the dielectric body for the discharge tube. This increases a crystallization rate of amorphous silicon.

Plasma jet requires very long process time in the case of a large area process because moving of the irradiation part on the XY stage restricts operation time of the process.

However, a structure of a film having a large area can be easily converted by generating plasma between the flat-plate electrodes using the flat electrodes, placing a substrate to which the film is attached between the flat-plate electrodes, and carrying out the plasma irradiation.

In this case, the electrode material is not particularly limited as described above. Similar to the plasma jet, a structure in which dielectric bodies are faced with each other in electrodes made by attaching a high voltage wire to the dielectric bodies with a conductive tape or a structure in which the metal electrodes themselves are faced with each other may be used.

The processing substrate is placed between these counter electrodes. However, the processing substrate may be directly placed on the lower electrode.

As described above, the plasma annealing device of the present invention is inexpensive compared with a conventional laser annealing device and can form a semiconductor film in a low temperature process that does not require high temperature used in the conventional device. Thus, the plasma annealing device has very useful technique for forming a semiconductor device using plastics.

EXAMPLE

Example 1

An amorphous silicon film formed by a CVD method was irradiated with plasma jet generated by a plasma irradiation device using a metal discharge tube (a stainless steel tube).

Change in the crystal state of the amorphous silicon film was analyzed by Raman spectroscopy. Here, the film formation and the plasma irradiation were carried out in the same device.

In the formation of the amorphous silicon film, $SiH_4$ having a flow rate of 200 sccm and He having a flow rate of 200 sccm are flown in a glow discharge decomposition device as a film formation gas. Sccm is an abbreviation of standard cc/min, and means cc ($cm^3$) per minute. The gas was introduced from a gas inlet into a reactor and injected to the surface of the substrate. The temperature of the substrate was set to 250° C. by a heater and glow discharge was carried out for 5 hours between a couple of substrate supports and electrodes using a high frequency electric power of 200 W to form an amorphous silicon film having a thickness of 30 μm.

The Raman spectrum of the obtained amorphous silicon film is illustrated in FIG. 4. The Raman spectrum was measured with a micro laser Raman spectrometer SEN-TERRA manufactured by Bruker Optics K. K. at a wavelength of 532 nm.

A broad peak was observed from 200 nm to 600 nm from the measurement result.

Subsequently, the film is irradiated with the generated plasma at 20° C. for 30 minutes using a plasma irradiation device in which the metal discharge tube (the stainless steel tube) is used as the discharge tube. At this time, the applied voltage was 10 kilovolts and the frequency was 10 kHz. The measurement result of the Raman spectrum after plasma irradiation is illustrated in FIG. 5.

In FIG. 6, the measurement results of the Raman spectra of the silicon film before the plasma irradiation (10) and after the plasma irradiation (11) are illustrated in an overlapped manner.

It was ascertained that the bonding state of the film constituent is changed, and thus, the crystal structure is changed from amorphous silicon to polysilicon, because a half width of the spectrum after plasma irradiation (11, the spectrum of FIG. 5) is narrower than a half width of the spectrum before plasma irradiation (10, the spectrum of FIG. 4).

INDUSTRIAL APPLICABILITY

In the method of the present invention, the crystal structure of a film can be changed by processing the film (coated film) on the substrate, and the plasma annealing method and device having excellent productivity can be provided.

DESCRIPTION OF THE REFERENCE NUMERALS

1 Discharge Tube
1-*a* High voltage electrode
2 Power source
3 Substrate
4 Stage
5 Schematic view illustrating plasma jet annealing device using discharge tube
6 Counter electrode
6*a* Upper electrode 6*b* Lower electrode
7 Power source
8 Upper electrode plate to which high voltage electrode is attached
9 Schematic view illustrating plasma annealing device using counter flat-plate electrodes
10 Raman spectrum of amorphous silicon film formed by CVD
11 Raman spectrum of film obtained by irradiating amorphous silicon film formed by CVD, with plasma by the method of present invention

The invention claimed is:

1. A method for producing a film by changing an amorphous silicon film to a polysilicon film while ascertaining the changing thereof by Raman spectroscopy analysis, comprising steps of:
    forming the amorphous silicon film by using a film formation gas on a substrate using a CVD method;
    (A) irradiating the amorphous silicon film on the substrate with atmospheric pressure plasma at room temperature, the plasma generated under atmospheric pressure in a range of 100 Torr higher or lower than 760 Torr, to change the amorphous silicon film to a polysilicon film; and
    before and after plasma irradiation, monitoring the change of the amorphous silicon film to a polysilicon film using Raman spectroscopy analysis,
    wherein the step (A) is a step of generating the plasma under the atmospheric pressure by energizing high voltage electrodes of a discharge tube at a frequency of 5 kHz to 20 kHz and a voltage of 5,000 volts to 10,000 volts for an irradiation time of 20 minutes to 1 hour, and flowing gas for plasma generation through an inside of the discharge tube at a flow rate of 30 ml/sec to 100 ml/sec, the discharge tube being made of metal, and directly irradiating the amorphous silicon film on the substrate with the generated plasma,
    both the film formation gas and the gas for plasma generation are gases containing helium, and
    the step of forming the amorphous silicon film and step (A) of irradiating with atmospheric pressure plasma are carried out within a same device, wherein the device does not include an air-tight vacuum chamber.

2. The method for producing a film according to claim 1, wherein the gas for plasma generation used in step (A) is at least one gas selected from the group consisting of helium, argon, krypton, xenon, hydrogen, nitrogen, oxygen, sulfur disulfide, hydrogen sulfide, water vapor, carbon monoxide, carbon dioxide, ammonia, a nitrogen oxide, a halogen, a hydrogen halide, silane, $GeH_4$, $PH_4$, $AsH_3$, $B_2H_6$.

3. The method for producing a film according to claim 1, wherein when oxygen is not used as the gas for plasma generation, step (A) is carried out in a chamber where an oxygen concentration is maintained 100 ppm or less.

4. The method for producing a film according to claim 3, wherein an oxide film is not formed during the irradiating.

5. The method for producing a film according to claim 1, wherein the discharge tube is made of a metal selected from the group consisting of aluminum, stainless steel, copper, iron, and brass.

6. The method for producing a film according to claim 1, wherein a temperature of the substrate does not rise during the irradiating.

7. The method for producing a film according to claim 1, wherein the amorphous silicon film on the substrate is heated to a temperature of from 50° C. to 450° C.

8. The method for producing a film according to claim 1, wherein the amorphous silicon film on the substrate is heated to a temperature of from 50° C. to 250° C.

9. A method for changing a crystal structure of a constituent of an amorphous silicon film while ascertaining the changing thereof by Raman spectroscopy analysis, the method comprising:

forming the amorphous silicon film with the constituent by using a film formation gas on a substrate using a CVD method;

(A) irradiating the constituent of the amorphous silicon film on the substrate with atmospheric pressure plasma at room temperature, the plasma generated under atmospheric pressure in a range of 100 Torr higher or lower than 760 Torr, to change the amorphous silicon film to a polysilicon film; and before and after plasma irradiation, monitoring the change of the amorphous silicon film to a polysilicon film using Raman spectroscopy analysis, wherein the step (A) is a step of generating the plasma under the atmospheric pressure by energizing high voltage electrodes of a discharge tube at a frequency of 5 kHz to 20 kHz and a voltage of 5,000 volts to 10,000 volts for an irradiation time of 20 minutes to 1 hour, and flowing gas for plasma generation through an inside of the discharge tube at a flow rate of 30 ml/sec to 100 ml/sec, the discharge tube being made of metal, and directly irradiating the constituent of the amorphous silicon film on the substrate with the generated plasma, both the film formation gas and the gas for plasma generation are gases containing helium, and the step of forming the amorphous silicon film with the constituent and step (A) of irradiating with atmospheric pressure plasma are carried out within a same device, wherein the device does not include an air-tight vacuum chamber.

10. The method for changing a crystal structure of a constituent of an amorphous silicon film according to claim 9, wherein the discharge tube is made of a metal selected from the group consisting of aluminum, stainless steel, copper, iron, and brass.

11. The method for producing a film according to claim 9, wherein an oxide film is not formed during the irradiating.

12. The method for producing a film according to claim 9, wherein a temperature of the substrate does not rise during the irradiating.

13. The method for producing a film according to claim 9, wherein the amorphous silicon film on the substrate is heated to a temperature of from 50° C. to 450° C.

14. The method for producing a film according to claim 9, wherein the amorphous silicon film on the substrate is heated to a temperature of from 50° C. to 250° C.

* * * * *